(12) United States Patent
Abe (10) Patent No.: US 6,796,803 B2
(45) Date of Patent: Sep. 28, 2004

(54) COMPUTER SYSTEM, SWITCH CONNECTOR, AND METHOD FOR CONTROLLING OPERATIONS OF THE COMPUTER SYSTEM

(75) Inventor: Takashi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/237,955

(22) Filed: Sep. 10, 2002

(65) Prior Publication Data

US 2003/0049949 A1 Mar. 13, 2003

(30) Foreign Application Priority Data

Sep. 13, 2001 (JP) ........................................ 2001-277466

(51) Int. Cl.⁷ ........................... H01R 12/00; H05K 1/00
(52) U.S. Cl. ......................................... 439/62; 439/61
(58) Field of Search .............................. 439/61–62, 55, 439/59–60; 710/300–304; 711/115

(56) References Cited

U.S. PATENT DOCUMENTS

| | | | | |
|---|---|---|---|---|
| 4,695,111 A | * | 9/1987 | Grabbe et al. | 439/266 |
| 4,969,824 A | * | 11/1990 | Casciotti | 439/62 |
| 5,145,381 A | * | 9/1992 | Volz | 439/62 |
| 5,316,486 A | * | 5/1994 | Tanaka et al. | 439/62 |
| 5,378,161 A | * | 1/1995 | Loder | 439/77 |
| 5,564,931 A | * | 10/1996 | Fabian et al. | 439/62 |
| 6,036,519 A | * | 3/2000 | Lopata et al. | 439/260 |

FOREIGN PATENT DOCUMENTS

| | | |
|---|---|---|
| JP | 61-273883 A | 12/1986 |
| JP | 1-236887 A | 9/1989 |
| JP | 9-161903 A | 6/1997 |
| JP | 11-312559 A | 11/1999 |

* cited by examiner

*Primary Examiner*—Michael C. Zarroli
(74) *Attorney, Agent, or Firm*—Sughrue Mion, PLLC (57) ABSTRACT

A plurality of switch connectors are arranged in each of a plurality of memory slots. Each of the plurality of switch connectors includes a first-type connector pin and a second-type connector pin. The first-type connector pin is coupled to one of a plurality of signal lines of a memory bus. The second-type connector pin is coupled to impedance matching circuits included in an load circuit. In each of the memory slots in which the memory module is not inserted, a pair of the first-type connector pin and the second-type connector pin provide flexible electric contact. In each of the memory slots in which the memory module is inserted, the first-type connector pin and the second-type connector pin are physically separated and insulated from each other. The first-type connector pin provides electric contact with module pins of the memory module.

8 Claims, 10 Drawing Sheets

FIG.1

PRIOR ART

COMPUTER SYSTEM, SWITCH CONNECTOR, AND METHOD FOR CONTROLLING OPERATIONS OF THE COMPUTER SYSTEM

BACKGROUND OF THE INVENTION

1. Field of the Invention

The present invention relates to a connector for changing the setting of a memory bus, in accordance with whether a memory module is inserted into each memory slot, and relates also to a computer system including the connector.

2. Description of the Related Art

In a computer system, such as a personal computer, etc., many devices are usually mounted on a predetermined printed-circuit board. One example of such a printed-circuit board is the motherboard of personal computers. On the motherboard, a CPU (Central Processing Unit), a main memory, a main controller, a BIOS-ROM (Basic Input/Output System-ROM), etc. are mounted. The CPU and the main memory send various signals (address, data, control, etc.) to each other through a memory bus, for information exchange.

The main memory is a RAM (Random Access Memory). The main memory is used as a memory area of the OS (Operating System) or application programs. Additionally, the main memory provides the CPU with a work area. The memory controller controls access operations of the CPU with respect to a plurality of memory chips included in the main memory.

In recent computer systems, the motherboard has a plurality of memory slots. Each of the plurality of memory slots has such a structure that a memory module can be inserted thereto or removed therefrom. Because of this structure, the main memory can be expanded. In each memory module, several memory chips are arranged on a single module substrate.

When the computer system is operated, it is necessary that at least one memory module be inserted in at least one memory slot. The number of memory modules to be inserted into the memory slots can be adjusted in accordance with the size of a program executed by the computer system.

Figure 1:
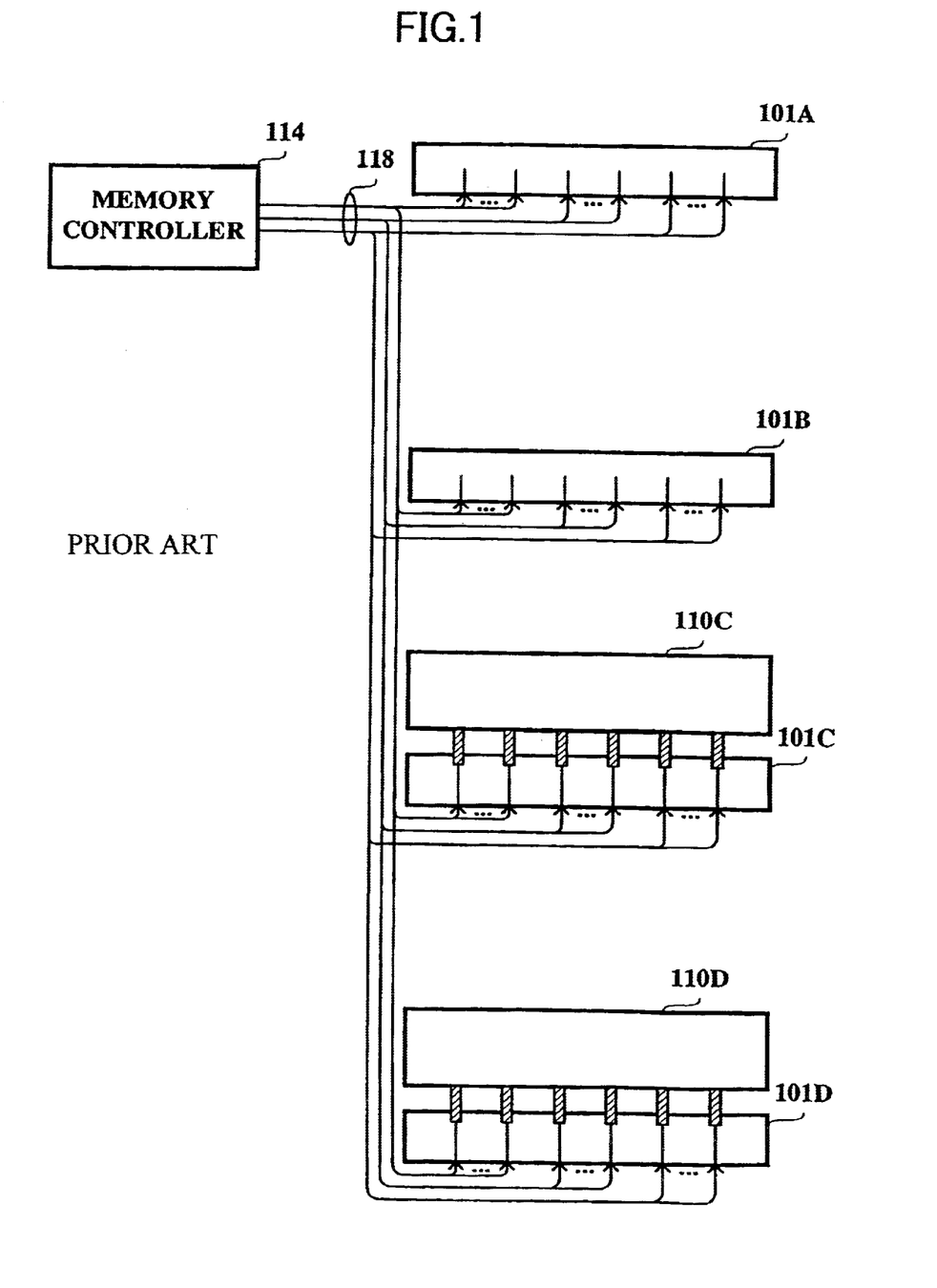
FIG. 1 is a diagram exemplarily showing a conventional computer system.

As seen from FIG. 1, a memory controller 114 is electrically coupled to four memory slots 10A, 101B, 101C and 101D, through a memory bus 118. DIMM (Dual Inline Memory Module) 110C and 110D are inserted respectively in the memory slots 101C and 101D. In this case, the memory slots 101A and 101B are empty.

In many cases, the signal transmission characteristics in the system shown in FIG. 1 are optimized in the case where the memory module is inserted in each of the entire memory slots 101A to 101D. Thus, as shown in FIG. 1, without the memory modules corresponding to the memory slots 101A and 101B, in the case where signals are sent from the memory controller 114 to the memory bus 118, signal reflection occurs in the memory slots 101A and 101B.

In addition, generally, the impedance of the memory controller 114 is different from the characteristic impedance of the memory bus 118. This impedance difference further causes signal reflection. A part of reflected signals in the memory slots 101A and 101B are reflected again in the memory controller 114.

Those signals reflected in the memory controller 114 are superposed on output signals of the memory controller 114. The superposition of the signals causes deterioration of waveforms of signals on the memory bus 118. In this manner, the reflected signals causes undesirable operations of the memory modules 110C and 110D inserted respectively in the memory slots 101C and 101D. For appropriate operations of a computer having memory modules or without memory modules, it is desired that the computer have such a structure for transmitting adequate signals between the memory controller and the memory modules.

There are several known techniques for reducing the undesirable effect of the signal reflection. For example, to reduce the signal amplification, the series resistance is included in a memory bus. In another example, the memory controller limits the driving range of the memory bus. In addition, the reduction in the signal line length on the motherboard may possibly improve the deterioration of the signal waveform.

To have high-speed operations of the CPU, it is necessary that the memory be operable at high speed. Recently, high-speed memory buses, which are operable at several hundred MHz, are realized.

According to conventional techniques, it is difficult to keep the transmission waveforms of signals, independently from the number of the inserted memory modules.

Unexamined Japanese Patent Application KOKAI Publication Nos. S61-273883, H1-236887, H9-161903, and H11-312559 each discloses a technique related to the switching structure that can change the setting of circuits in a case where a plug connector is inserted in a receptacle connector.

SUMMARY OF THE INVENTION

The present invention has been made in consideration of the above. It is accordingly an object of the present invention to provide a technique for desirably transmitting signals on high-speed memory buses, regardless of whether at least one memory module is inserted in at least one memory connector.

Another object thereof is to provide a technique for relieving the limitation on the driving range of the memory controller and the limitation on the length of the signal line on the motherboard.

In order to achieve the above objects, according to the first aspect of the present invention, there is provided a computer system comprising:

a plurality of memory slots each of which has a structure for accepting a memory module inserted therein and includes a plurality of connector terminals for being in contact with module pins formed in said memory module;

a memory bus which includes a plurality of signal lines coupled to the at least one connector terminal of each of said plurality of memory slots;

a memory controller which is coupled to a plurality of memory chips on said memory module inserted in at least one of said plurality of memory slots, through said memory bus; and at least one electric load, and wherein
said plurality of memory slots includes
a first part of memory slots which is coupled to said memory module and provides electrical contact between the plurality of signal lines of said memory bus and the module pins, respectively, using their corresponding connector terminals, and
a second part of memory slots which is not coupled to said memory module and provides electric contact between the plurality of signal lines of said memory bus and the electric load using their corresponding connector terminals.

Impedance of the electric load may approximately be equal to impedance of said memory module.

The electric load may be at least one series circuit including a resistance device and a capacitive device or at least one capacitive device.

The resistance device may be a variable resistor; and/or the capacitive device may be a variable capacitor.

In order to achieve the above objects, according to the second aspect of the present invention, there is provided a computer system comprising:

a plurality of memory slots each of which has a structure for accepting a memory module inserted therein and includes a plurality of connector terminals for being in contact with module pins formed in said memory module;

a memory bus which includes a plurality of signal lines coupled to at least one of said plurality of connector terminals of each of said plurality of memory slots;

a memory controller which is coupled to a plurality of memory chips on said memory module inserted in at least one of said plurality of memory slots, through said memory bus; and a plurality of impedance matching circuits, and wherein:

said plurality of connector terminals included in each of said plurality of memory slots includes a first-type connector pin which is coupled to one of said plurality of signal lines of said memory bus, and a second-type connector pin which is coupled to a corresponding electric load;

said first-type connector pin and said second-type connector pin are electrically in contact with each other, in a case where the memory module is not inserted in each of said plurality of memory slots; and said first-type connector pin and said second-type connector pin are electrically insulated from each other, and the first-type connector pin and said module pins of said memory module are electrically in contact with each other, in a case where the memory module is coupled to each of said memory slots.

Impedance of said electrical load may approximately be equal to impedance of said memory module.

The electric load may be at least one series circuit including a resistance device and a capacitive device or at least one capacitive device.

The resistive device may be a variable resistor, and/or said capacitive device may be a variable capacitor.

In order to achieve the above objects, according to the third aspect of the present invention, there is provided a switch connector which is adaptable to a computer system including, a memory bus, at least one memory slot and an electrical load, wherein:

said switch connector couples one of a plurality of signal lines of said memory bus to one of a plurality of module pins of a memory module, in a case where said memory module is inserted in said at least one memory slot; and said switch connector couples the one of said plurality of signal lines of said memory bus to said electric load, in a case where said memory module is not inserted in said at least one memory slot.

The switch connector may be disposed inside said at least one memory slot.

In order to achieve the above objects, according to the fourth aspect of the present invention, there is provided a switch connector which is adaptive to a computer system including, a memory bus, at least one memory slot and an electrical load, comprising:

a first connector pin which is coupled to one of a plurality of signal lines of said memory bus; and a second connector pin which is coupled to said electric load, and wherein said switch connector provides electric contact between said first connector pin and said second connector pin, in a case where a memory module is not inserted in said at least one memory slot, and said switch connector insulates said first connector pin from said second connector pin, in a case where said memory module is not inserted in said at least one memory slot.

One end of said first connector pin may be fixed on a casing of said at least one memory slot; and other end of said first connector pin provides flexible electric contact with said second connector pin or with one of a plurality of module pins of said memory module.

In order to achieve the above objects, according to the fifth aspect of the present invention, there is provided a method of controlling operations of a computer system including a plurality of memory slots, comprising:

arranging a plurality of memory connectors on each of said plurality of memory slots;

coupling a plurality of bus lines respectively to said plurality of memory connectors;

coupling at least one impedance matching circuit to at least one of said plurality of memory connectors;

coupling said plurality of bus lines to a memory module, in at least one of said plurality of memory slots in which the memory module is inserted; and coupling said at least one impedance matching circuit to at least one of said plurality of bus lines, in at least one of said plurality of memory slots in which the memory module is not inserted.

The method may further comprise:

coupling said plurality of bus lines respectively to first-type connector pins included in each of said plurality of memory connectors;

coupling said at least one impedance matching circuit to at least one of second-type connector pins included in at least one of said plurality of memory connectors;

providing electric contact between said first-type connector pins and module pins of the memory module, in the at least one of said plurality of memory slots in which the memory module is inserted; and providing electric contact between said first-type connector pins and said second-type connector pins, in at least one of said plurality of memory slots in which the memory module is not inserted.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

Figure 2:
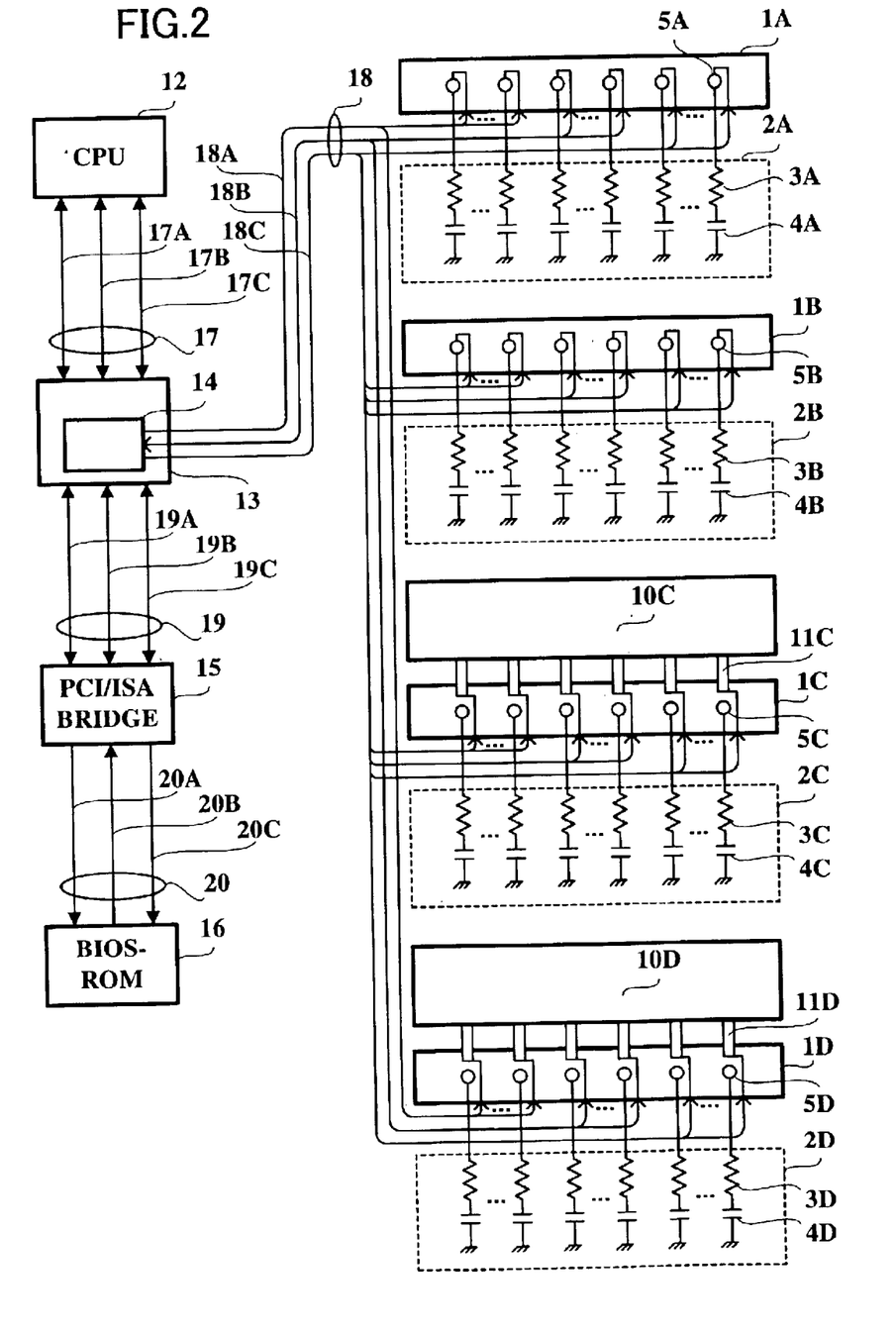
FIG. 2 is a diagram exemplarily showing a computer system according to an embodiment of the present invention.

FIG. 2 shows the structure of a computer system of the present invention, by way of example.

In the system shown in FIG. 2, memory modules 10C and 10D, called DIMM (Dual Inline Memory Module), are inserted respectively in memory slots 1C and 1D. The memory can not be inserted into memory slots 1A and 1B.

In the DIMM, a plurality of memory chips are mounted on one module substrate. Each of the plurality of memory chips is coupled to a plurality of module signal lines. The plurality of module signal lines are insulated from each other, and coupled to their corresponding module pins. In the DIMM, the module pins are arranged both on the right surface and back surface of the module substrate. The DIMM can mechanically be inserted in the memory slots 1A to 1D and removed therefrom.

A CPU 12 shown in FIG. 2 is coupled to a host/PCI bridge 13 through a host bus 17. The host bus 17 includes an address bus 17A, a data bus 17B and a control bus 17C.

The host/PCI bridge 13 includes a memory controller 14. The memory controller 14 controls access operations of the CPU 12 with respect to the individual memory chips forming the main memory. In other words, in the system of FIG. 2, the memory controller 14 provides information exchange between the CPU 12 and the memory modules 10C and 10D.

The memory bus 18 is coupled among the memory controller 14 and the memory slots 1A to 1D. The memory bus 18 may be coupled to a bus-line voltage source (not illustrated in FIG. 2) through an end-terminal resistor. For example, the memory bus 18 includes a memory address bus 18A, a memory data bus 18B, and a RAS/CAS/WE 18C. The memory address bus 18A sends memory address signals from the memory controller 14 to the memory slots 1A to 1D. The memory data bus 18B transmits signals corresponding to data to be read from or to be written into a memory address specified by the memory address bus 18A, between the memory controller 14 and the memory slots 1A and 1D. A RAS (Row Address Strobe) of the RAS/CAS/WE 18C transmits information representing the timing for reading row address signals, from the controller 14 to memory chips included the memory modules (e.g. the memory modules 10C and 10D shown in FIG. 2) inserted into the memory slots 1A to 1D. A CAS (Column Address Strobe) of the RAS/CAS/WE 18C transmits information representing the timing for reading the column address signals, from the memory controller 14 to the chips in the memory modules. A WE (Write Enable) of the RAS/CAS/WE 18C permits the memory chips in the memory modules to write data.

In FIG. 2, the memory address bus 18A is illustrated in the form of a single signal line. In fact, however, the memory address bus 18A has a plurality of signal lines. This applies, for example, to the memory data bus 18B and the RAS/CAS/WE 18C, as well.

A PCI bus 19 is coupled between the host/PCI bridge 13 and a PCI/ISA bridge 15. The PCI bus 19 includes an address bus 19A, a data bus 19B and a control bus 19C.

The ISA bus 20 is coupled between the PCI/ISA bridge 15 and a BIOS/ROM 16. The ISA bus 20 includes an address bus 20A, a data bus 20B and a control bus 20C.

The PCI/ISA bridge 15 controls data exchange between the PCI bus 19 and the ISA bus 20. The BIOS-ROM 16 stores a predetermined setup program. The setup program is to control the computer system entirely, during the period of time since the power source is supplied to the system of FIG. 2 until the activation of the OS. The setup program is read by the CPU 12 and used for activating the OS.

In the computer system shown in FIG. 2, four memory slots 1A, 1B, 1C, and 1D are coupled to the memory bus 18 and also respectively to load circuits 2A, 2B, 2C, and 2D. A plurality of switch connectors 5A to 5D are arranged inside each of the memory slots 1A to 1D. The numbers of the switch connectors 5A to 5D correspond to the numbers of the module pins in the memory modules (DIMM) inserted in the memory slots 1A to 1D, respectively. The switch connectors 5A to 5D include first-type connector pins 6A to 6D, respectively, and also second-type connector pins 7A to 7D, respectively. The first-type connector pins 6A to 6D and the second-type connector pins 7A to 7D are all conductors, for example, metal electrodes.

Each of the first-type connector pins 6A to 6D is coupled to one signal line of the memory bus 18. The plurality of second-type connector pins 7A are coupled to the impedance matching circuits of the load circuit 2A, and the same applies to the second-type connector pins 7A to 7D with their corresponding load circuits 2A to 2D.

Figure 3:
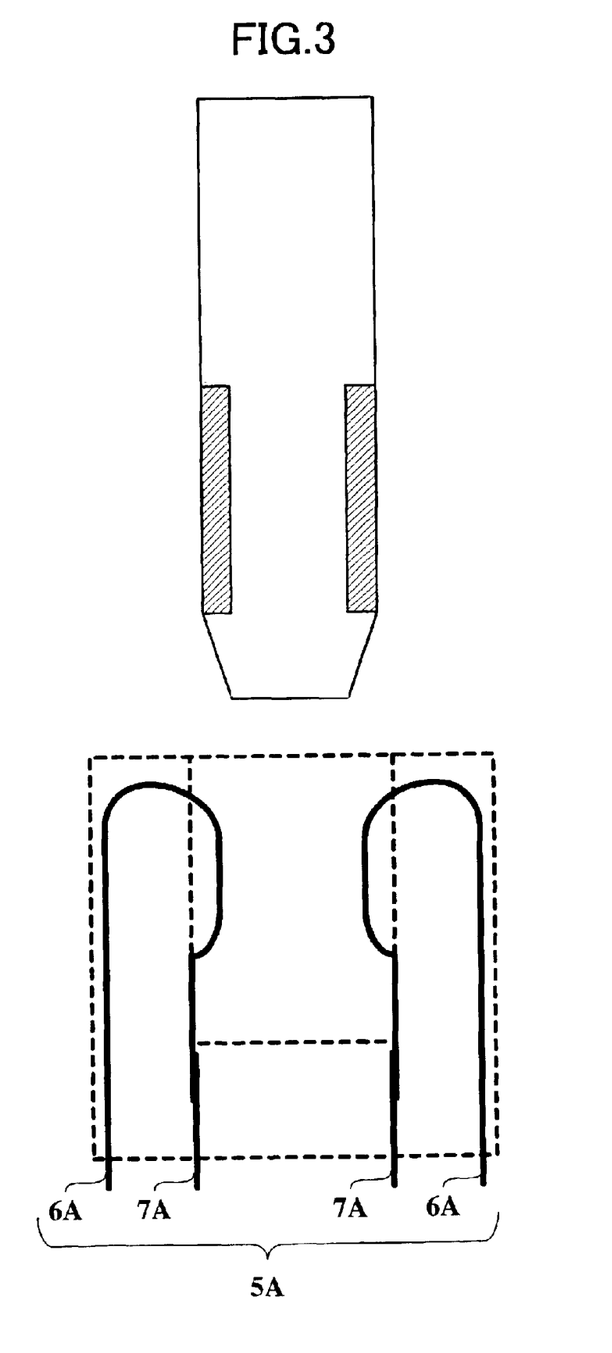
FIG. 3 is a diagram showing a switch connector having no memory module inserted therein, in the computer system of FIG. 2.

In the memory slot 1A having no module inserted therein, the pair of the first-type connector pin 6A and the second-type connector pin 7A provide flexible electric contact therebetween, as shown in FIG. 3. Each signal line (the memory address bus 18A, the memory data bus 18B, the RAS/CAS/WE 18C) of the memory bus 18 is coupled to one impedance matching circuit of the load circuit 2A. The memory slot 1B is in the same state as that of the memory slot 1A.

Figure 4:
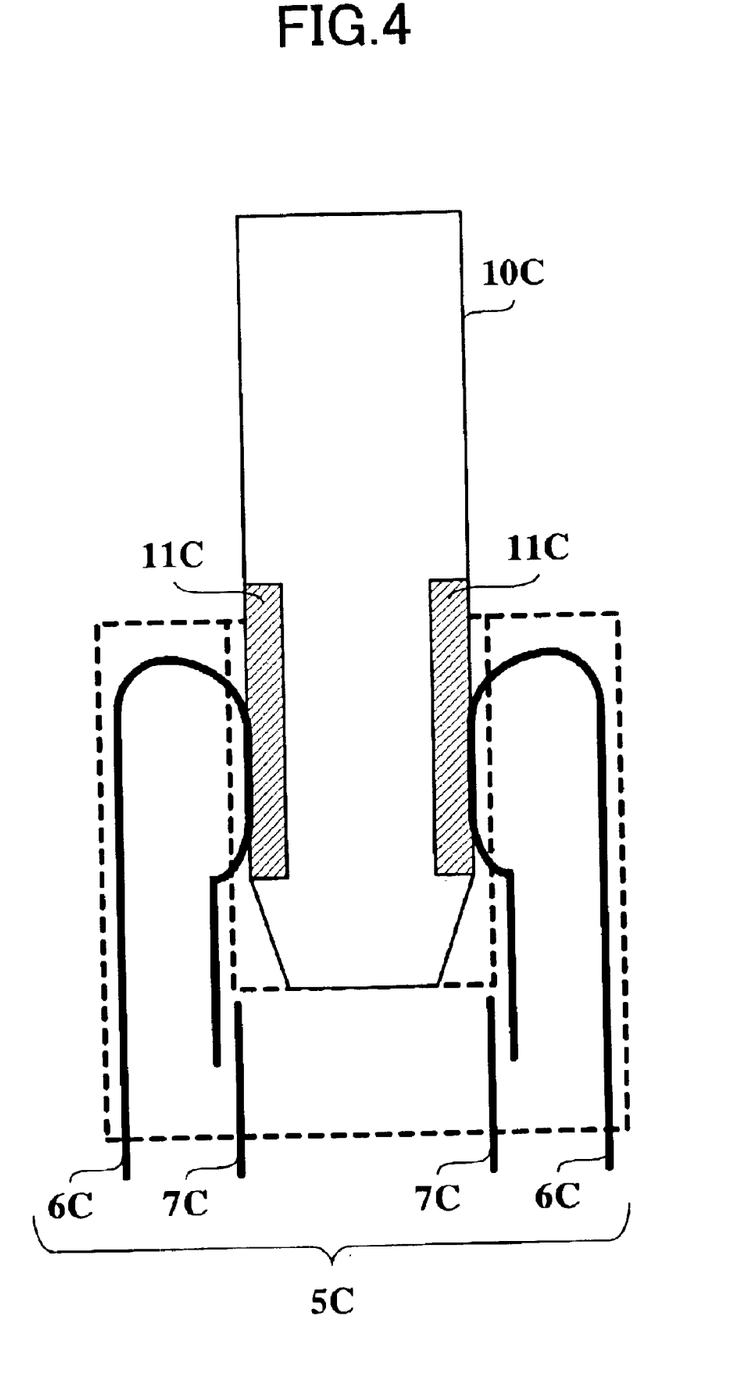
FIG. 4 is a diagram showing a switch connector in which a memory module is inserted, in the computer system of FIG. 2.

In the memory slot 1C in which the memory module 10C is inserted, the pair of the fist-type connector pin 6C and the second-type connector pin 7C are physically separated and electrically insulated from each other. The first-type connector pin 6C provides electric contact between the first-type connector pin 6C and a module pin 11C of the memory module 10C. The first-type connector pin 6C provides the module pin 11C of the memory module 10C with mechanical spring force. Thus, while the memory module 10C is inserted in the memory slot 1C, the electric contact is maintained between the first-type connector pins 6C and the module pins 11C of the memory module 10C. The memory module 10C is coupled to the memory controller 14 through the memory bus 18. The load circuit 2C is electrically open. In this manner, the information exchange path is established between the memory module 10C and the CPU 12. The memory slot 1D is in the same state as that of the memory slot 1C.

A group of switch connectors 5A are disposed along a longitudinal side of an insertion space for inserting the memory module in the memory slot 1A, while the other group thereof are disposed along the other longitudinal side of the insertion space, in a manner corresponding to the module pins of the DIMM, respectively. This applies to the memory slots 1B to 1D in association with their switch connectors 5B to 5D.

In this manner, one end of each of the first-type connector pins 6A to 6D is fixed on the casing of its corresponding one of the memory slots 1A to 1D. The other end of each of the first-type connector pins 6A to 6D provides flexible contact between the other end thereof and a module pin of the memory module or its corresponding one of the second-type connector pins 7A to 7D.

Each of the load circuits 2A to 2D includes a plurality of impedance matching circuits. For example, the number of the impedance matching circuits included in each of the load circuits 2A to 2D is the same as the number of each of the corresponding switch connectors 5A to 5D.

One example of the impedance matching circuits is a series circuit including one resistance device and one capacitive device. For example, in the load circuit 2A, a series circuit of a resistance device 3A and a capacitive device 4A is coupled between the second-type connector pin 7A and the ground. In another example, the impedance matching circuit may be a clamp circuit having a diode which is reversely connected to the ground or the power source, or may be a clamp circuit using the both.

The impedance of each of the load circuits 2A to 2D is approximately equal to the impedance of one memory module. For example, the resistance of each series circuit of each of the load circuits 2A to 2D is typically equal to or less than 33 ohms. The capacity of each series circuit is typically in a range between 5 and 10 pF. In the case where the resistance of a module to be used is substantially 0 ohm, each of the load circuits 2A to 2D may include a plurality of capacitive devices only. To set the impedance to fit for various kinds of memory modules, each of the load circuits 2A to 2D may adopt a variable resistor and/or a variable capacitor.

In the high-frequency range, the impedance of each of the load circuits 2A to 2D is equal to that of the memory module. Thus, while the main memory is driven, the signal reflection in the empty memory slots (the memory slots 1A and 1B in FIG. 2) decreases. A decrease in the signal reflection guarantees the accuracy of the signal form of signals in the memory bus 18.

On the other hand, in the low-frequency range, each of the load circuits 2A to 2D is electrically cut off. Hence, while the main memory is suspended, almost no power is consumed in each of the load circuits 2A to 2D.

For example, the load circuits 2A to 2D are soldered onto the switch connectors 5A to 5D, respectively, and may be fixed on a printed-circuit board (e.g. the motherboard, etc.). The load circuits 2A to 2D may be attachable/detachable to/from the switch connectors 5A to 5D, respectively.

Operations of the computer system according to the embodiment of the present invention will now be described.

Figure 5:
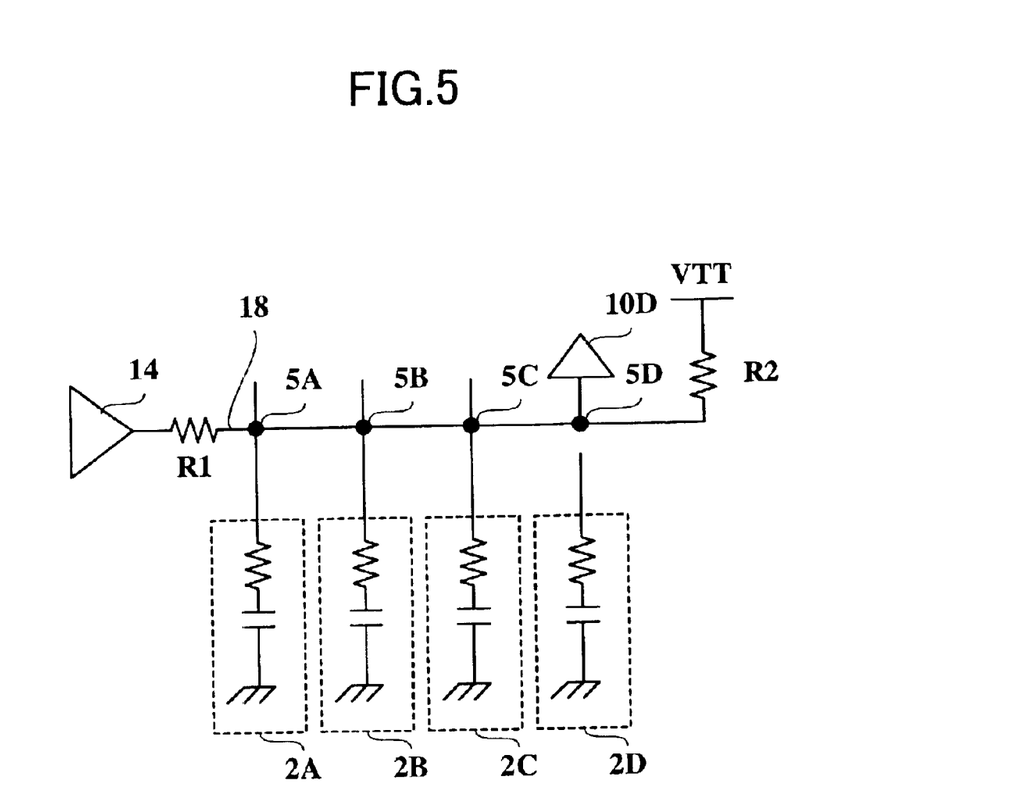
FIG. 5 is a diagram showing an equivalent circuit of the computer system according to the present invention.

FIG. 5 is a diagram showing an equivalent circuit of the computer system related to the embodiment of the present invention, in a case where only the memory module 10D is inserted in the memory slot 1D. In the circuit of FIG. 5, a line resistor R1 is incorporated in the memory bus 18, and limits the driving range of the memory controller 14. The memory bus 18 is coupled to a bus line voltage VTT through a pull-up resistor R2. In FIG. 5, the load circuits 2A to 2D include the respective resistance devices 3A to 3D, the respective capacitive devices 4A to 4D. In fact, the number of the resistance devices 3A to 3D, the number of the capacitive devices 4A to 4D and the number of the switch connectors 5A to 5D are the same as the number of the module pins of the memory modules.

In the circuit shown in FIG. 5, one memory module 10D is inserted only one memory slot 1D included in the plurality of memory slots 1A to 1D. The load circuit 2D is electrically open. The load circuits 2A to 2C are coupled to the memory bus 18. The memory module 10D is coupled to the memory controller 14 through the switch connector 5D and the memory bus 18.

For example, the resistance devices 3A to 3D are 10 ohms, and the capacitive devices 4A to 4D are 5 pF.

Figure 6:
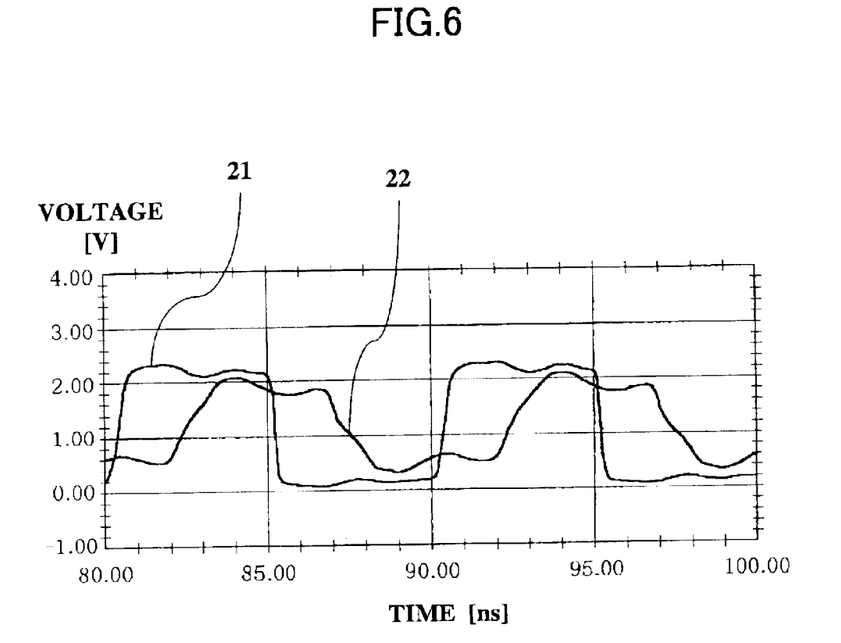
FIG. 6 is a waveform diagram showing signal waveforms measured in the circuit of FIG. 5.

FIG. 6 is a waveform diagram showing signal waveforms measured in the circuit shown in FIG. 5. FIG. 6 shows signal waveforms 21 and 22 representing rectangular waves of signals which are serially transmitted from the memory controller 14 to the memory bus 18. The signal waveform 21 is measured at the output terminal of the memory controller 14, while the signal waveform 22 is measured at the module pin of the memory module 10D.

The signal waveform 22 includes a signal delay applied to the signal waveform 21. The signal waveform 22 has only little deterioration of its waveform.

Figure 7:
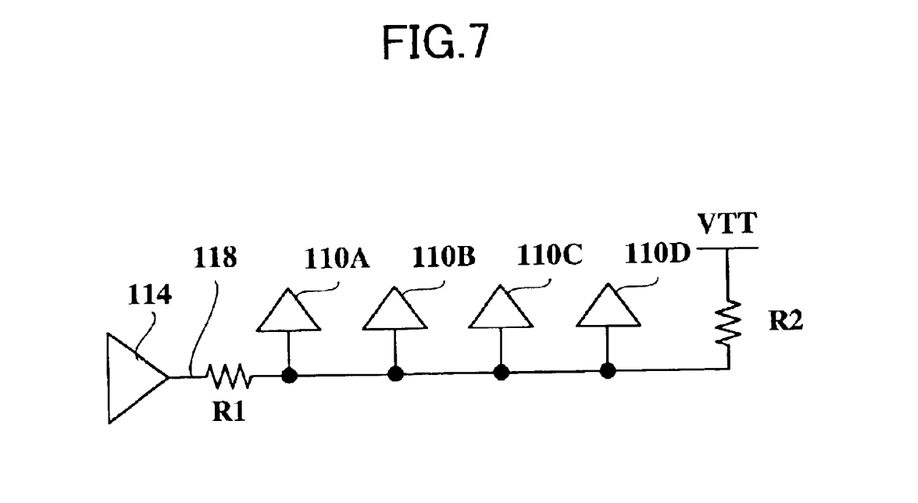
FIG. 7 is a diagram showing an equivalent circuit of a computer system in comparison with the computer system according to the embodiment of the present invention.

For the comparison sake with the present invention, FIG. 7 shows an equivalent circuit of a computer system, wherein memory modules 110A to 110D are inserted in all memory slots 101A to 101D included in the system shown in FIG. 1. The circuit shown in FIG. 7 corresponds to a DDR-SDRAM data bus circuit.

In the circuit shown in FIG. 7, four memory modules 110A to 110D are inserted into the entire memory slots 101A to 101D, respectively.

Figure 8:
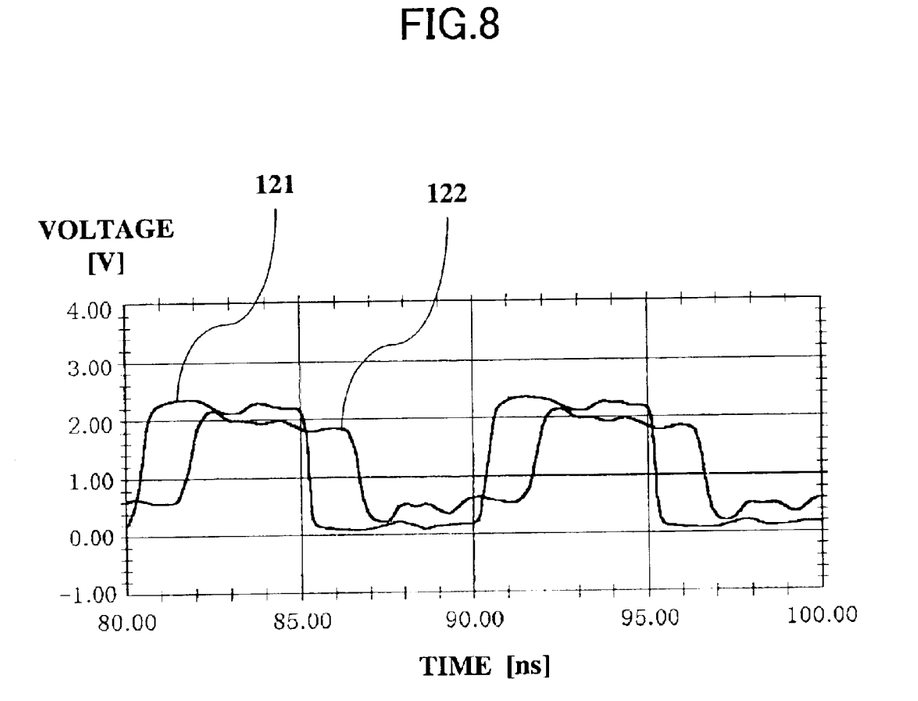
FIG. 8 is a waveform diagram showing signal waveforms measured in the circuit of FIG. 7.

FIG. 8 is a waveform diagram showing signal waveforms measured in the circuit of FIG. 7. FIG. 8 shows signals waveforms 121 and 122 representing waveforms of signals which are serially transmitted from a memory controller 114 to a memory bus 118. The signal waveform 121 is measured at the output terminal of the memory controller 114, while the signal waveform 122 is measured at the module pin of the memory module 110D.

The signal waveform 122 includes a signal delay applied to the signal waveform 121. The form of the signal waveform 122 is pretty much similar to that of the signal waveform 121. Insertion of the memory modules 110A to 110D in the circuit shown in FIG. 7 into the respective entire memory slots 101A to 101D causes high accuracy of signals in the memory bus 118.

Figure 9:
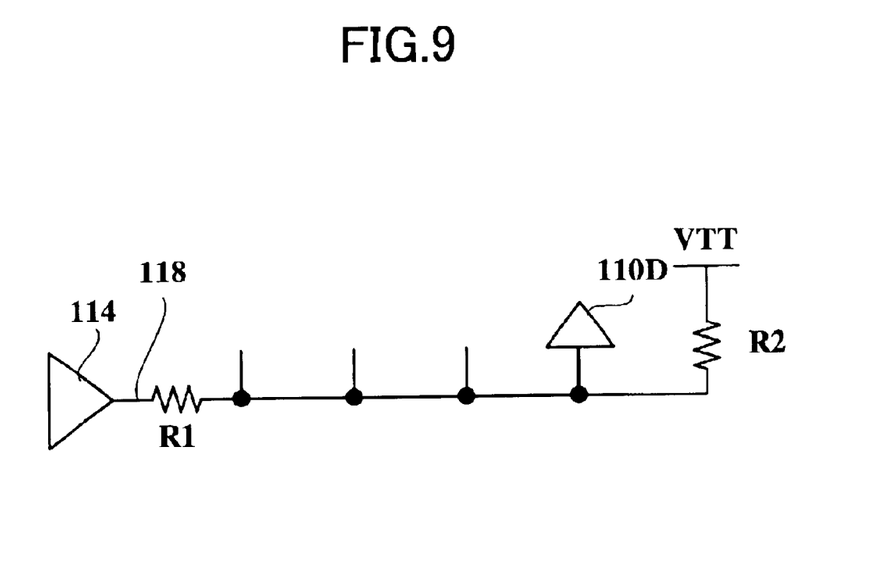
FIG. 9 is a diagram showing an equivalent circuit of a computer system in comparison with the computer system according to the embodiment of the present invention.

For further comparison with the present invention, FIG. 9 shows an equivalent circuit of a computer system, wherein the memory module 110D is inserted into only the memory slot 101D included in the system shown in FIG. 1. The circuit shown in FIG. 9 corresponds to a DDR-SDRAM data bus circuit.

In the circuit shown in FIG. 9, one memory module 110D is inserted only one memory slot 101D which is included in the plurality of memory slots 101A to 101D. In this structure, the memory slots 101A to 101C are empty.

Figure 10:
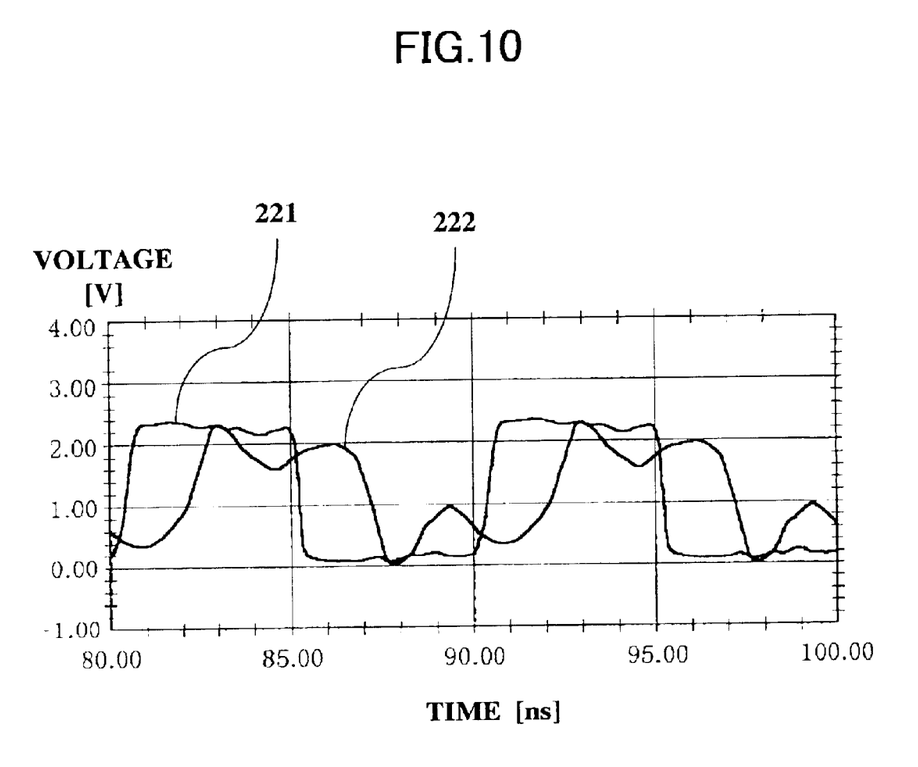
FIG. 10 is a waveform diagram showing signal waveforms measured in the circuit of FIG. 9.

FIG. 10 is a waveform diagram showing signal waveforms of signals measured in the circuit shown in FIG. 9. FIG. 10 shows signal waveforms 221 and 222 representing waveforms of signals transmitted serially from the memory controller 114 to the memory bus 118. The signal waveform 221 is measured at the output terminal of the memory controller 114, while the signal waveform 222 is measured at the module pin of the memory module 110D.

The signal waveform 222 includes a signal delay applied to the signal waveform 221. In addition, the signal waveform 222 has signal deterioration based on the signal reflection.

As compared to the signal waveform 122 shown in FIG. 8, the signal waveform 22 is delayed approximately by 1 nsec. The signal deterioration of the signal waveform 22 is approximately the same as that of the signal waveform 122. The signal deterioration of the signal waveform 22 has nothing to do with the operations of the memory module 10D.

As compared to the signal waveform 122 shown in FIG. 8, the signal waveform 222 shown in FIG. 10 is much more delayed than the signal waveform 122. Further, the signal deterioration of the signal waveform 222 is greater than that of the signal waveform 122. The signal deterioration of the signal waveform 222 causes undesirable operations of the memory module 110D.

One memory module is always inserted into each of the circuit shown in FIG. 5 and the circuit shown in FIG. 9. Based on this fact, it is obvious that the signal waveform 22 shown in FIG. 6 gets better than the signal waveform 222 shown FIG. 10.

In the computer system of the present invention, regardless of whether the memory module is inserted in each memory slot, the input impedance of the memory bus is maintained substantially constant. Hence, the computer system, which is designed to be optimum in the case where the memory module is inserted into each of the entire memory slots, has substantially constant signal transmission characteristics, regardless of whether the memory modules are inserted into the memory slots.

The switch connectors 5A to 5D includes the respective first-type connector pins 6A to 6D, and also the respective second-type connector pins 7A to 7D. In the case where no memory module is inserted into the memory slots, each pair of the first-type connector pins 6A to 6D and the second-type connector pins 7A to 7D provide connection between one of the signal lines of the memory bus 18 and one of the impedance matching circuits. In the case where the memory modules are inserted into the memory slots, each pair of the first-type connector pins 6A to 6D and the second-type connector pins 7A to 7D provide connection between one of the signal lines of the memory bus 18 and one of the module pins of the memory modules, and also cause the impedance matching circuits to be electrically open.

It is assessed that the connection of the impedance matching circuits to the memory bus results in an electrical reduction of the bus length. Hence, the connection of the impedance matching circuits to the memory bus relieves the limitation on the driving range of the memory controller and the limitation on the length of the signal line on the motherboard.

Various embodiments and changes may be made thereonto without departing from the broad spirit and scope of the invention. For example, the memory module to be inserted into each memory slot may be a SIMM. To correspond to the SIMM, the switch connectors 5A to 5D may be arranged on only one side of the insertion space of the respective memory slots 1A to 1D. Any other arbitrary memory device may be used as each of the memory modules. The number of the memory slots is not limited to four.

In each of the switching connectors 5A to 5D, only a part of the second-type connector pins 7A to 7D may be coupled to the impedance matching circuits. In many cases, the signal transmission characteristics may remarkably vary in a part of signal lines of the memory bus, in accordance with whether the memory module is inserted into each memory slot. On the other hand, the signal transmission characteristics may not vary in the rest of signal lines of the memory bus, in accordance with whether the memory module is inserted into each memory slot. In such cases, only one or more of the second-type connector pins 7A to 7D, which correspond(s) to the signal lines whose signal transmission characteristics are likely to vary, may be coupled to the impedance matching circuits. The rest of the second-type connector pins 7A to 7D, i.e. any of the second-type connector pins that is (are) not coupled to the impedance matching circuits, may be removed from the memory slots 1A to 1D. In other words, it is satisfactory, as long as each of the load circuits 2A to 2D includes at least one impedance matching circuit.

The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2001-277466 filed on Sep. 13, 2001, and including specification, claims, drawings and summary. The disclosure of the above Japanese Patent Application is incorporated herein by reference in its entirety.

What is claimed is:

1. A computer system comprising:
   a plurality of memory slots each of which has a structure for accepting a memory module inserted therein and includes a plurality of connector terminals for being in contact with module pins formed in said memory module;
   a memory bus which includes a plurality of signal lines coupled to the at least one connector terminal of each of said plurality of memory slots;
   a memory controller which is coupled to a plurality of memory chips on said memory module inserted in at least one of said plurality of memory slots, through said memory bus; and
   at least one electric load, and wherein
      said plurality of memory slots includes
         a first part of memory slots which is coupled to said memory module and provides electrical contact between the plurality of signal lines of said memory bus and the module pins, respectively, using their corresponding connector terminals, and
         a second part of memory slots which is not coupled to said memory module and provides electric contact between the plurality of signal lines of said memory bus and the electric load using their corresponding connector terminals.
2. The computer system according to claim 1, wherein impedance of the electric load is approximately equal to impedance of said memory module.

3. The computer system according to claim 1, wherein
the electric load is at least one series circuit including a resistance device and a capacitive device or at least one capacitive device.

4. The computer system according to claim 3, wherein:
the resistance device is a variable resistor; and/or
the capacitive device is a variable capacitor.

5. A computer system comprising:
a plurality of memory slots each of which has a structure for accepting a memory module inserted therein and includes a plurality of connector terminals for being in contact with module pins formed in said memory module;
a memory bus which includes a plurality of signal lines coupled to at least one of said plurality of connector terminals of each of said plurality of memory slots;
a memory controller which is coupled to a plurality of memory chips on said memory module inserted in at least one of said plurality of memory slots, through said memory bus; and
a plurality of electric loads, and wherein:
said plurality of connector terminals included in each of said plurality of memory slots includes
a first-type connector pin which is coupled to one of said plurality of signal lines of said memory bus, and
a second-type connector pin which is coupled to a corresponding one of said plurality of electric loads;
said first-type connector pin and said second-type connector pin are electrically in contact with each other, in a case where the memory module is not inserted in each of said plurality of memory slots; and
said first-type connector pin and said second-type connector pin are electrically insulated from each other, and the first-type connector pin and said module pins of said memory module are electrically in contact with each other, in a case where the memory module is coupled to each of said memory slots.

6. The computer system according to claim 5, wherein
impedance of each of said plurality of electric loads is approximately equal to impedance of said memory module.

7. The computer system according to claim 5, wherein
each of said plurality of electric loads is at least one series circuit including a resistance device and a capacitive device or at least one capacitive device.

8. The computer system according to claim 7, wherein:
said resistance device is a variable resistor, and/or
said capacitive device is a variable capacitor.

* * * * *